United States Patent [19]

Buergel et al.

[11] Patent Number: 5,367,198
[45] Date of Patent: Nov. 22, 1994

[54] PROXIMITY DETECTOR WITH ERROR-PREVENTING AMBIENT CONDITION COMPENSATION

[75] Inventors: Johannes Buergel, Tettnang; Jean-Luc Lamarche, Langenargen; Andreas Schiff, Eriskirch; Klaus-Peter Westrup, Markdorf, all of Germany

[73] Assignee: i f m electronic gmbh, Essen, Germany

[21] Appl. No.: 804,733

[22] Filed: Dec. 11, 1991

Related U.S. Application Data

[63] Continuation-in-part of Ser. No. 712,899, Jun. 11, 1991, abandoned.

[30] Foreign Application Priority Data

Jun. 11, 1990 [DE] Germany .............................. 4018680
Jul. 24, 1990 [DE] Germany .............................. 4023529
Apr. 8, 1991 [DE] Germany .............................. 4111297

[51] Int. Cl.$^5$ ............................................. H01H 36/00
[52] U.S. Cl. ................................. 307/116; 340/551; 361/180
[58] Field of Search ...................... 307/116–118, 307/308, 311; 361/179–181; 340/551, 552, 561, 568; 328/5

[56] References Cited

U.S. PATENT DOCUMENTS

| | | | |
|---|---|---|---|
| 3,725,748 | 4/1973 | Atkins | 361/181 |
| 3,747,012 | 7/1973 | Buck | 340/551 X |
| 3,872,398 | 3/1975 | Fausone et al. | 328/5 X |
| 4,135,124 | 1/1979 | Buck | 361/180 X |
| 4,424,458 | 1/1984 | Buck et al. | 340/691 |
| 4,502,042 | 2/1985 | Wührl et al. | 307/116 X |
| 4,672,230 | 6/1987 | Spähn | 307/116 |
| 4,792,764 | 12/1988 | Walker et al. | 328/5 X |
| 4,841,163 | 6/1989 | Mueller | 307/116 |
| 5,079,502 | 1/1992 | Rogacki et al. | 324/207.19 |

FOREIGN PATENT DOCUMENTS

| | | |
|---|---|---|
| 0049795 | 4/1982 | European Pat. Off. . |
| 0244311 | 11/1987 | European Pat. Off. . |
| 2065249 | 7/1971 | France . |
| 3123828 | 2/1982 | Germany . |
| 3440027 | 5/1986 | Germany . |
| 3214836 | 2/1987 | Germany . |
| 3722336 | 3/1989 | Germany . |
| 1-170218 | 7/1989 | Japan ........................ 361/179 |
| 2-256316 | 10/1990 | Japan ........................ 361/179 |

OTHER PUBLICATIONS

Siemens Aktiengesellschaft, Integrierte Schaltungen Fuer Industrielle Anwendungen, Datenbuch, 1982/1983.

Primary Examiner—A. D. Pellinen
Assistant Examiner—Fritz M. Fleming
Attorney, Agent, or Firm—Sixbey, Friedman, Leedom & Ferguson

[57] ABSTRACT

An electronic switching device such as an inductive proximity switch includes an externally influenced oscillator detector with its output connected to a switching amplifier. An electronic switch connected to the output of the switching amplifier responds to the amplifier signal and controls a state indicator. Upon the influence state of the detector crossing a predetermined threshold, the switching state of the electronic switch is reversed, and the detection state of the oscillator is reflected in switching states of the electronic switch and indicated by the state indicator. A second state indicator indicates whether or not the reading from the oscillator is in a "safe range" in which variations in ambient conditions cannot cause a false reading.

7 Claims, 6 Drawing Sheets

PROXIMITY DETECTOR WITH ERROR-PREVENTING AMBIENT CONDITION COMPENSATION

This is a continuation-in-part of U.S. patent application Ser. No. 07/712, filed Jun. 11, 1991, now abandoned.

BACKGROUND OF THE INVENTION

The present invention relates to an electronic switching device such as an inductive, capacitive or optoelectronic proximity switch, having an externally influenced detector which may take the form of an oscillator with a switching amplifier, and having an electronic switch such as a transistor, thyristor or triac, connected to the switching amplifier output of the detector, and also having a status indicator, the detector changes the switching state of the electronic switch when the output of the detector crosses a predetermined threshold, and the detector or the electronic switch changes the state of the status indicator in response.

Electronic switching devices of this type are designed as contactless devices and have been used increasingly for about 20 years now in place of electric, mechanically actuated switching devices that are designed with contacts. These devices are particularly useful in electric or electronic measuring, control and regulator circuits. Such proximity switches generate an indication when an influence element to which the proximity switch is sensitive, such as steel or a magnet, has come sufficiently close to the proximity switch. If an influence element for which the proximity switch is sensitive comes sufficiently close to the proximity switch, then the detector of the proximity switch changes the state of the electronic switch. If the switching device is designed as a normally open switch, the nonconducting electronic switch becomes conducting, and if the switching device is designed as a normally closed switch, the conducting electronic switch becomes blocked. With switching devices of the type being discussed, it can also be determined whether the physical quantity of influence material in proximity to the switch exceeds or falls below a suitable value.

Thus an essential component of electronic switching devices of the above-described type is, among other things, an externally influenced detector.

For example, an oscillator that can be influenced inductively or capacitively can be used as a detector to make an inductive or capacitive proximity switch, respectively. A photoresistor, a photodiode or a phototransistor can also be used as a detector to form an optoelectronic proximity switch. Finally, a temperature measuring circuit can be used as a detector to make a flow controller.

With inductive proximity switches, as long as a metal part has not yet reached a predetermined distance, $K \times V = 1$ for the oscillator, with $K$=feedback factor and $V$=gain of the oscillator, so that the oscillator oscillates. If the corresponding metal part reaches the predetermined distance, then the increasing attenuation of the oscillator leads to a decrease in gain $V$, and the amplitude of the oscillator's output decreases so that the oscillator ceases to oscillate. With capacitive proximity switches, as long as the capacitance of a sensing element is less than the capacitance between a sensing electrode and another electrode, $K \times V$ is less than 1 and the oscillator does not oscillate. When the sensing element reaches the predetermined distance, then the increasing capacitance between the response electrode and the other electrode leads to an increase in feedback factor $K$, so that $K \times V$ becomes equal to 1, and the oscillator begins to oscillate. In either type of switch—the inductive proximity switch and capacitive proximity switch—the electronic switch, such as a transistor, thyristor or triac, is controlled as a function of the state of the oscillator.

Optoelectronic proximity switches include an optotransmitter and an optoreceiver and detect the passage of light. The two major classes of optoelectronic proximity switches are (1) The type in which the optotransmitter and the optoreceiver are placed on opposite sides of a path to be monitored, and (2) a type in which the optotransmitter and optoreceiver are placed on the same end of a path to be monitored, while a reflector placed on the other end of the path to be monitored reflects the light beam emanating from the optotransmitter back to the optoreceiver. In both cases, the detector responds when the light beam that normally goes from the optotransmitter to the optoreceiver is interrupted by an influence element in the path to be monitored. Some optoelectronic proximity switches of the second type use a suitable influence element itself to reflect the light beam emanating from the optotransmitter back to the optoreceiver.

Another essential component of electronic switching devices of the initially and above-described type is the state indicator, by which various influence states of the detector or various switching states of the electronic switch are indicated.

Some electronic contactless switching devices have a state indicator, such as an LED, which supplies only an indication of one of two states: "below threshold" or "threshold exceeded." The state indicator is generally connected to the switching device so that it indicates whether the electronic switch is turned off or conducting.

With electronic switching devices of the type being discussed, the switching threshold generally cannot be determined independently of ambient influences. Rather, starting from a value desired and determined more or less precisely during manufacturing, the switching threshold will change according to ambient conditions, such as temperature, humidity, and contamination of lenses in the case of optoelectronic devices. A certain operating range immediately below and above the theoretical switching point must therefore be regarded as an "unsafe range." The state assumed by the device when the level of the external stimuli is in the "unsafe range" is unpredictable because the state assumed depends on ambient conditions.

SUMMARY OF THE INVENTION

Therefore, it is a general object of the present invention to provide an electronic switching device having predictable performance in the range near the theoretical switching point despite variations in ambient conditions.

This object, and others which will become apparent upon review of the specification and the claims, is achieved in the present invention by providing a proximity switch circuit in which the state indicator, or another state indicator provided for this purpose, indicates whether or not the influencing material level sensed by the detector, by being either significantly above or significantly below the switching threshold, is in a "safe range." In this context, the term "safe range" means that normal variation in the switching point of the circuit due to ambient conditions will not affect the state of the detector or the state of the electronic switch.

Because a state indicator in the electronic switching device of the present invention indicates whether or not the influence state of the detector, once it exceeds or falls below a predetermined threshold, is in a "safe range," it is possible to install and adjust the switching device so that it does not respond to ambient influences but rather responds only when the influence state of the detector is purposely influenced by an influence element actuating the detector.

The electronic switching device of the present invention may be constructed as an inductive proximity switch with an oscillator as a detector. The operation of such an oscillator is influenced by the proximity of an approaching or retreating metal part. Once the metal part approaches to a predetermined sensing distance or retreats to a predetermined sensing distance, i.e., once the operation of the oscillator has been significantly influenced by the change in proximity, the circuit of the present invention automatically changes the effective sensing distance, so that a significant change in the output signal of the switching amplifier occurring after the change in the sensing distance adjustment does not lead to a change in the switching state of the electronic switch. The state indicator, or a second state indicator if desired, is controlled by the significant change in the output signal of the switching amplifier and, after a predetermined cycle time, the change in the sensing distance adjustment is cancelled. If the oscillator uses a sensing distance resistor or a resistor network for sensing distance adjustment, the effective resistance value of the sensing distance resistor or of the sensing distance resistor network can be changed to influence the oscillator. When the oscillator uses a sensing distance resistor network to adjust the sensing distance, the change can be achieved by short-circuiting a single resistor of the sensing distance resistor network to thus influence the oscillator.

As previously noted, in an electronic switching device according to the invention embodied as an inductive proximity switch with an oscillator as a detector, a significant change in the output signal of the switching amplifier occurring after changing the sensing distance adjustment does not lead to a change in the switching state of the electronic switch. When a programming unit that specifies a normally-open or normally-closed characteristic is placed upstream from the electronic switch, the change in sensing distance adjustment can be achieved by reprogramming the programming unit upon the occurrence of a significant change in the output signal of the switching amplifier, following the change in the sensing distance adjustment.

Another preferred embodiment of the invention uses a change generator to periodically change the adjustment of the sensing distance by a random amount. Specifically, the sensing distance is reduced or increased, so that a significant change in the output signal of the switching amplifier occurring after changing the adjustment of the sensing distance does not lead to a change in the switching state of the electronic Switch. Also, the state indicator or a second state indicator is then controlled by the significant change in the output signal of the switching amplifier. The amount of "random" change in the sensing distance is the part of the sensing distance that can result as an undesired change from the above-described ambient conditions. Thus, using the change generator of the present invention, the maximally possible changes in the sensing distance due to ambient conditions are periodically simulated. Consequently, in the electronic switching device of the present invention, the state indicator or a second state indicator provided for this purpose indicates whether or not the influence state of the detector is in a "safe range" or an "unsafe range" once it exceeds or falls below a predetermined threshold.

It is generally desirable that electronic switching devices of this type have as high an operating frequency capability as possible. On the other hand, it is sufficient if the state indicator, with which it is indicated whether or not the influence state of the detector is in a "safe range" or in an "unsafe range" once it exceeds or falls below a predetermined threshold, operates at a relative low indication frequency. Consequently it is preferred that the change generator change the adjustment of the sensing distance at a relatively low change frequency, such as 5 cycles per second or less.

DETAILED DESCRIPTION OF THE PREFERRED EMBODIMENTS

While the present invention will be described in terms of an inductive proximity switch, the principles of the present invention can be readily applied to other types of electronic switching devices of the types described in the background discussion, and especially to inductive, capacitive and optoelectronic proximity switches and to flow controllers. There are numerous methods of configuring the system of the present invention in accordance with the broad teachings of the invention.

In explaining the invention in terms of an inductive proximity switch, it will be assumed that the sensing distance of the inductive proximity switch is determined by a sensing distance resistor provided in the oscillator of the inductive proximity switch or by a sensing distance resistor network. Nevertheless, those skilled in the art will recognize that the embodiments shown can also be used with circuits determining the sensing distance of the inductive proximity switch by other methods.

The electronic switching device of the present invention may be constructed as an inductive proximity switch with an oscillator as a detector. The operation of such an oscillator is influenced by the proximity of an approaching or retreating metal part. Once the metal part approaches to a predetermined sensing distance or retreats to a predetermined sensing distance, i.e., once the operation of the oscillator has been significantly influenced by the change in proximity, the circuit of the present invention automatically changes the effective sensing distance, so that a significant change in the output signal of the switching amplifier occurring after the change in the sensing distance adjustment does not lead to a change in the switching state of the electronic switch. The state indicator, or a second state indicator if desired, is controlled by the significant change in the output signal of the switching amplifier and, after a predetermined cycle time, the change in the sensing distance adjustment is cancelled. If the oscillator uses a sensing distance resistor or a resistor network for sensing distance adjustment, the effective resistance value of the sensing distance resistor or of the sensing distance resistor network can be changed to influence the oscillator. When the oscillator uses a sensing distance resistor network to adjust the sensing distance, the change can be achieved by short-circuiting a single resistor of the sensing distance resistor network to thus influence the oscillator.

As previously noted, in an electronic switching device according to the invention embodied as an inductive proximity switch with an oscillator as a detector, a significant change in the output signal of the switching amplifier occurring after changing the sensing distance adjustment does not lead to a change in the switching state of the electronic switch. When a programming unit that specifies a normally-open or normally-closed characteristic is placed upstream from the electronic switch, the change in sensing distance adjustment can be achieved by reprogramming the programming unit upon the occurrence of a significant change in the output signal of the switching amplifier, following the change in the sensing distance adjustment.

Another preferred embodiment of the invention uses a change generator to periodically change the adjustment of the sensing distance by a random amount. Specifically, the sensing distance is reduced or increased, so that a significant change in the output signal of the switching amplifier occurring after changing the adjustment of the sensing distance does not lead to a change in the switching state of the electronic switch. Also, the state indicator or a second state indicator is then controlled by the significant change in the output signal of the switching amplifier. The amount of "random" change in the sensing distance is the part of the sensing distance that can result as an undesired change from the above-described ambient conditions. Thus, using the change generator of the present invention, the maximally possible changes in the sensing distance due to ambient conditions are periodically simulated. Consequently, in the electronic switching device of the present invention, the state indicator or a second state indicator provided for this purpose indicates whether or not the influence state of the detector is in a "safe range" or an "unsafe range" once it exceeds or falls below a predetermined threshold.

It is generally desirable that electronic switching devices of this type have as high an operating frequency capability as possible. On the other hand, it is sufficient if the state indicator, with which it is indicated whether or not the influence state of the detector is in a "safe range" or in an "unsafe range" once it exceeds or falls below a predetermined threshold, operates at a relative low indication frequency. Consequently it is preferred that the change generator change the adjustment of the sensing distance at a relatively low change frequency, such as 5 cycles per second or less.

Figure 1:
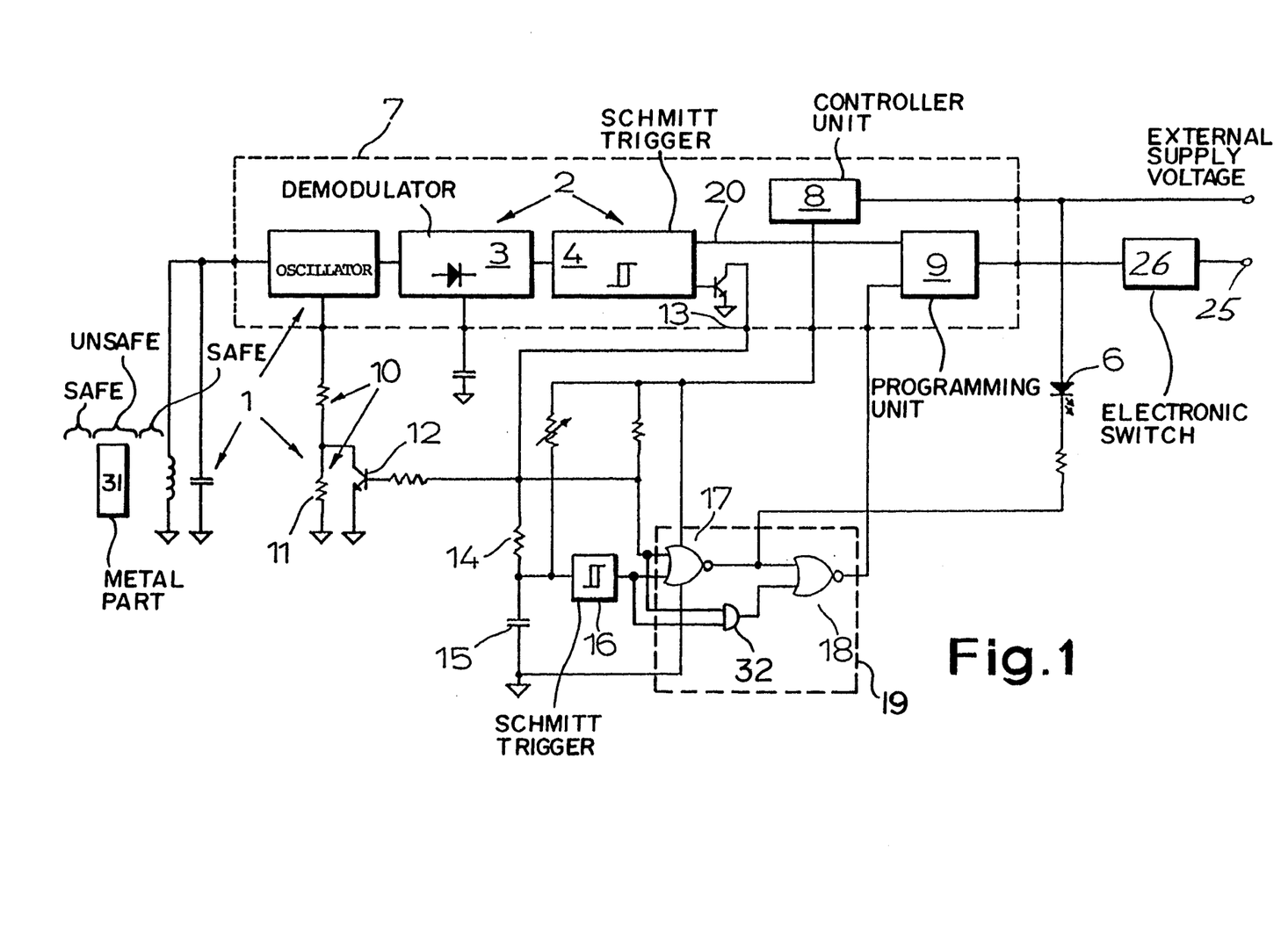
FIG. 1 is a block-schematic diagram of an inductive proximity switch according to the present invention.

FIGS. 1–6 show partial block-schematic diagrams of the inductive proximity switch of the present invention. Referring first to FIG. 1, the inductive proximity switch of the present invention includes an oscillator 1 which functions as an externally influenced detector that can be influenced by an approaching or retreating metal part 31, a switching amplifier 2 connected to the output of oscillator 1 and including demodulator 3 and Schmitt trigger 4, and state indicator 6.

In general, an inductive proximity switch of this type will include an electronic switch 26 that can be controlled by oscillator 1 through switching amplifier 2. This switch will generally be a transistor, a thyristor or a triac. The oscillator 1 then reverses the switching state of the electronic switch 26 when the influence state of the detector exceeds or falls below a predetermined threshold, i.e., if the metal part 31 approaches up to a predetermined sensing distance or retreats by a predetermined sensing distance. State indicator 6, which includes a light emitting diode (LED), indicates various influence states of oscillator 1 or various switching states of the electronic switch 26.

State indicator 6 indicates whether or not the influence state of the detector, once it exceeds or falls below a predetermined threshold, is in a "safe" area. That is, state indicator 6 indicates whether oscillator 1 is in a "safe" area once the metal part 31 approaches up to a predetermined sensing distance or retreats by a predetermined sensing distance. Here, "safe range" means, as explained previously, that ambient conditions cannot independently change an existing influence state of the detector (oscillator 1), or cannot change an existing switching state of the electronic switch 26.

Figure 2:
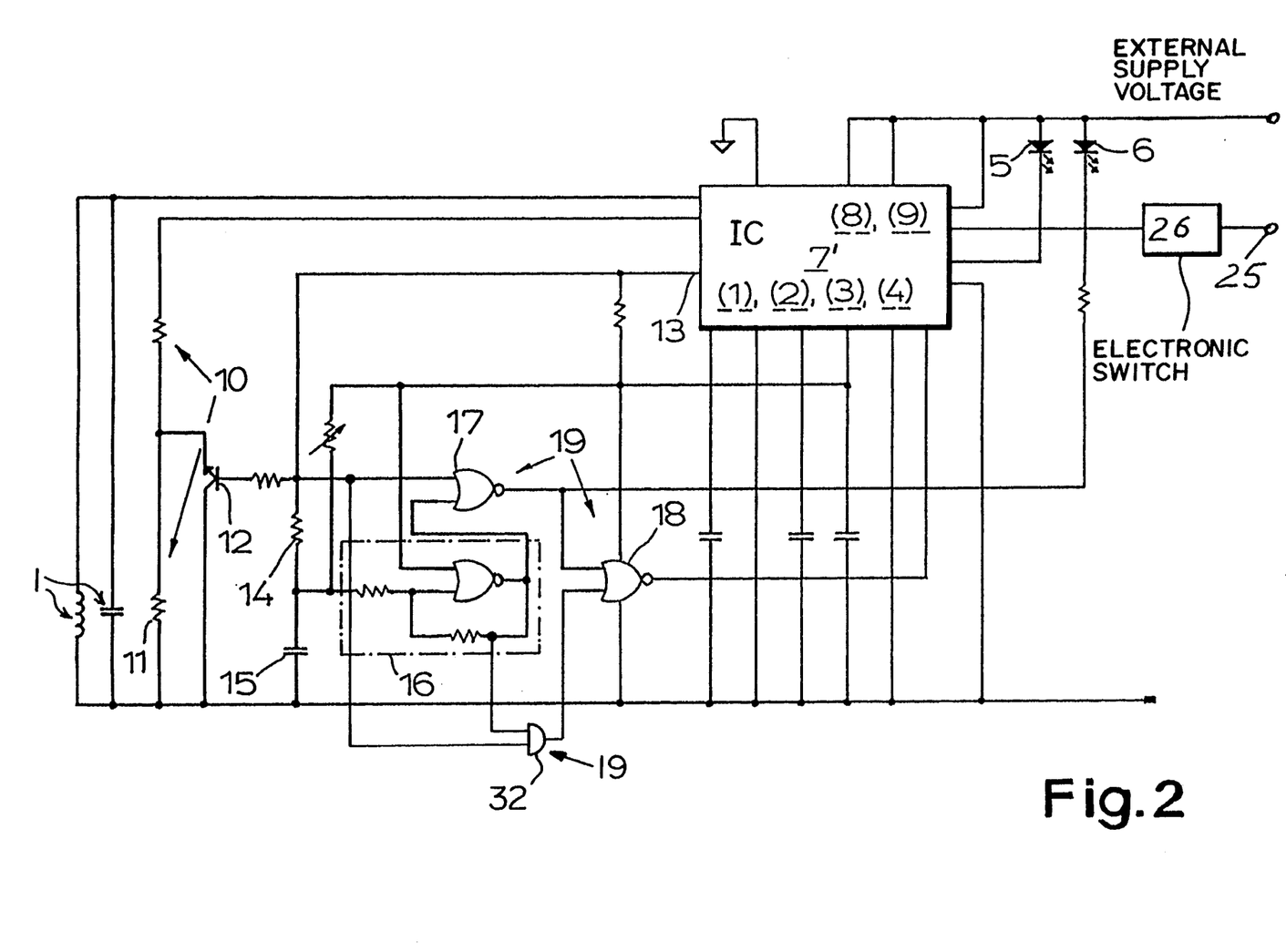
FIG. 2 an alternative embodiment of the circuit of FIG. 1 using integrated circuit components.
Figure 3:
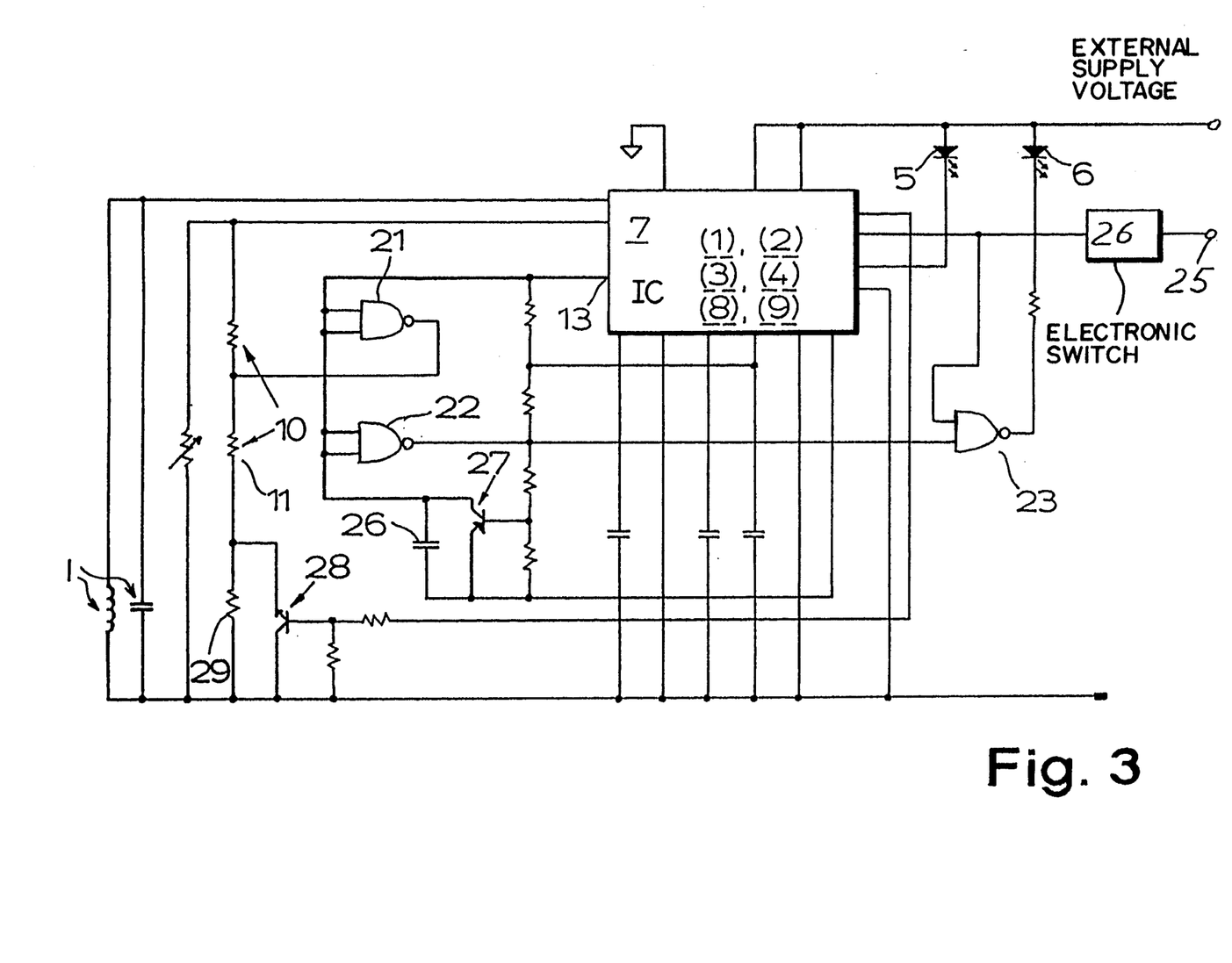
FIG. 3 is an alternative embodiment of the circuit of FIG. 2 substituting logic gates for a transistor switch.

In the inductive proximity switch represented in FIGS. 1 to 3, once the metal part (not shown) approaches up to a predetermined sensing distance or retreats by a predetermined sensing distance, and oscillator 1 has thus been significantly influenced, the sensing distance adjustment is automatically increased or decreased internally, so that a significant change in the output signal of switching amplifier 2 occurring after the change in the sensing distance adjustment does not lead to a change in the switching state of the electronic switch 26.

In the embodiments of the invention shown in FIGS. 1–6, oscillator 1 includes a sensing distance resistor network 10. Here the effective resistance value of sensing distance resistance network 10 is changed; namely, a single resistor 11 of sensing distance resistor network 10 is short-circuited, specifically by a switching transistor 12 controlled by the output of switching amplifier 2. This short-circuiting operation is performed in the embodiments of FIGS. 1 to 3 to influence the operation of oscillator 1.

FIG. 2 shows a further embodiment of the invention in which two state indicators 5 and 6 are provided, each comprising an LED. State indicator 5 responds to a significant change in the output signal of switching amplifier 2. Also, in the electronic switching device of the present invention, an integrated circuit, shown as IC 7', may be used as shown in FIG. 2. The components implemented using IC 7' are indicated by the dotted lines in FIG. 1; IC 7' incorporates a portion of oscillator 1, switching amplifier 2 with demodulator 3 and Schmitt trigger 4, a controller unit 8 and a programming unit 9. The function of the controller unit 8 is to supply the other elements of the switching device with a constant internal supply voltage even if the external supply voltage is not constant.

The general operation of the inductive proximity switch shown in FIGS. 1 to 3 is as follows: If the metal part 31 approaches the proximity switch within a predetermined sensing distance, it causes a significant change in the output signal of switching amplifier 2. In this way, the electronic switch 26 is caused to change states, and at the same time, the adjustment of the sensing distance is changed. Specifically, the effective sensing distance is reduced by short-circuiting single resistor 11 of sensing distance resistor network 10. If the output signal of switching amplifier 2 significantly changes, the change will be "suppressed" with respect to the switching state of the electronic switch 26; namely, programming unit 9 is reprogrammed. Simultaneously, single resistor 11 of sensing distance resistor network 10 is again "activated," so that the above-explained change in the adjustment of the sensing distance is cancelled. The above-explained course of operation is constantly repeated so that indicator output 13 of switching amplifier 2 constantly changes state. This cyclical state change at indicator output 13 of switching amplifier 2 is indicated by state indicator 6; a switchover that occurs at indicator output 13 of switching amplifier 2 and that is continuously repeated thus indicates that the metal part 31 influencing oscillator 1 is in the "unsafe range."

If the above-explained change in the adjustment of the sensing distance does not lead to a significant change in the output signal of switching amplifier 2, then a switchover does not occur at indicator output 13 of switching amplifier 2. The metal part 31 that influences oscillator 1 is thus determined to be in the "safe range."

In the above-explained operation, state indicator 6 actively indicates the "unsafe range"; if the metal part 31 is in the "unsafe range," then the LED provided as state indicator 6 illuminates. When the metal part 31 is in the "safe range," the LED provided as state indicator 6 does not illuminate.

Referring now to FIG. 3, a further refinement of the inductive proximity switch of FIG. 2 is shown. In this embodiment, NAND gates are provided in place of the switching transistor 12 used in the embodiments of FIGS. 1 and 2, as a sensing distance adjustment means. As shown in FIG. 3, the inputs of NAND gate 21 are connected together so that a signal that is inverse to the signal at the input appears at the output. Both inputs of NAND gate 21 are connected to indicator output 13 of switching amplifier 2. Another NAND gate 22, with both inputs connected to indicator output 13 of switching amplifier 2, has its output connected to an input of a third NAND gate 23. The second input of the third NAND gate 23 is connected to switching device output 25, while the cathode of the LED of second state indicator 6 is connected to the output of third NAND gate 23. A charging capacitor 26 connected to indicator output 13 has a discharge transistor 27 connected in parallel thereto, and is operated inversely to selectively prevent switching of the device. Finally, another hysteresis transistor 28—again operated inversely—is provided, with which a hysteresis resistor 29 can be short-circuited.

In the embodiment of FIGS. 1 and 2, the "unsafe range" is indicated below and above the theoretical switching point. In contrast, in the embodiment of FIG. 3, only a part of the "unsafe range" is indicated, namely the "unsafe range" below the theoretical switching point.

If indicator output 13 of switching amplifier 2 conveys a low-level signal, then switching transistor 12 is conductive, and single resistor 11 of sensing distance resistor network 10 is short-circuited. (In FIG. 1, switching transistor 12 is "normally operated." In contrast, switching transistor 12 in FIG. 2 is "inversely operated," causing a lower saturation voltage to be reached.) As soon as the low signal is present at the interconnection of the series circuit consisting of a charging resistor 14 and charging capacitor 15, located at indicator output 13 of signal amplifier 2, the output of Schmitt trigger 16 connected there to its input conveys a low level signal. The output of Schmitt trigger 16 goes to an input of an XOR gate 19 consisting of two NOR gates 17 and 18 and AND gate 22. The other input of XOR gate 19 is connected to indicator output 13' of switching amplifier 2. The output of XOR gate 19 is connected to an input of programming unit 9 implemented using an XOR gate with its other input connected to switching output 20 of switching amplifier 2.

Figure 4:
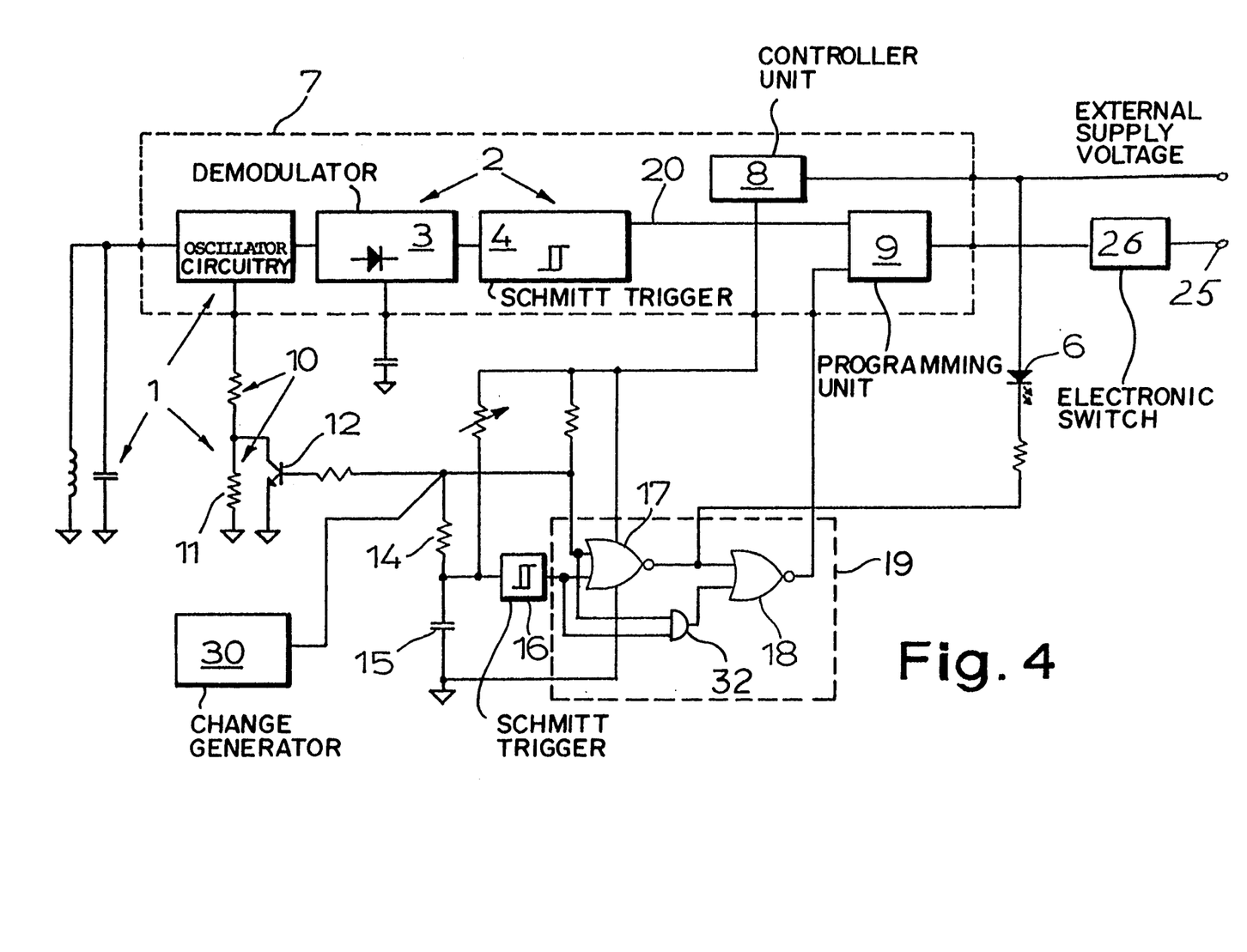
FIG. 4 is a block-schematic diagram of another alternative embodiment of the electronic switching device of the present invention including a change controlling device.
Figure 5:
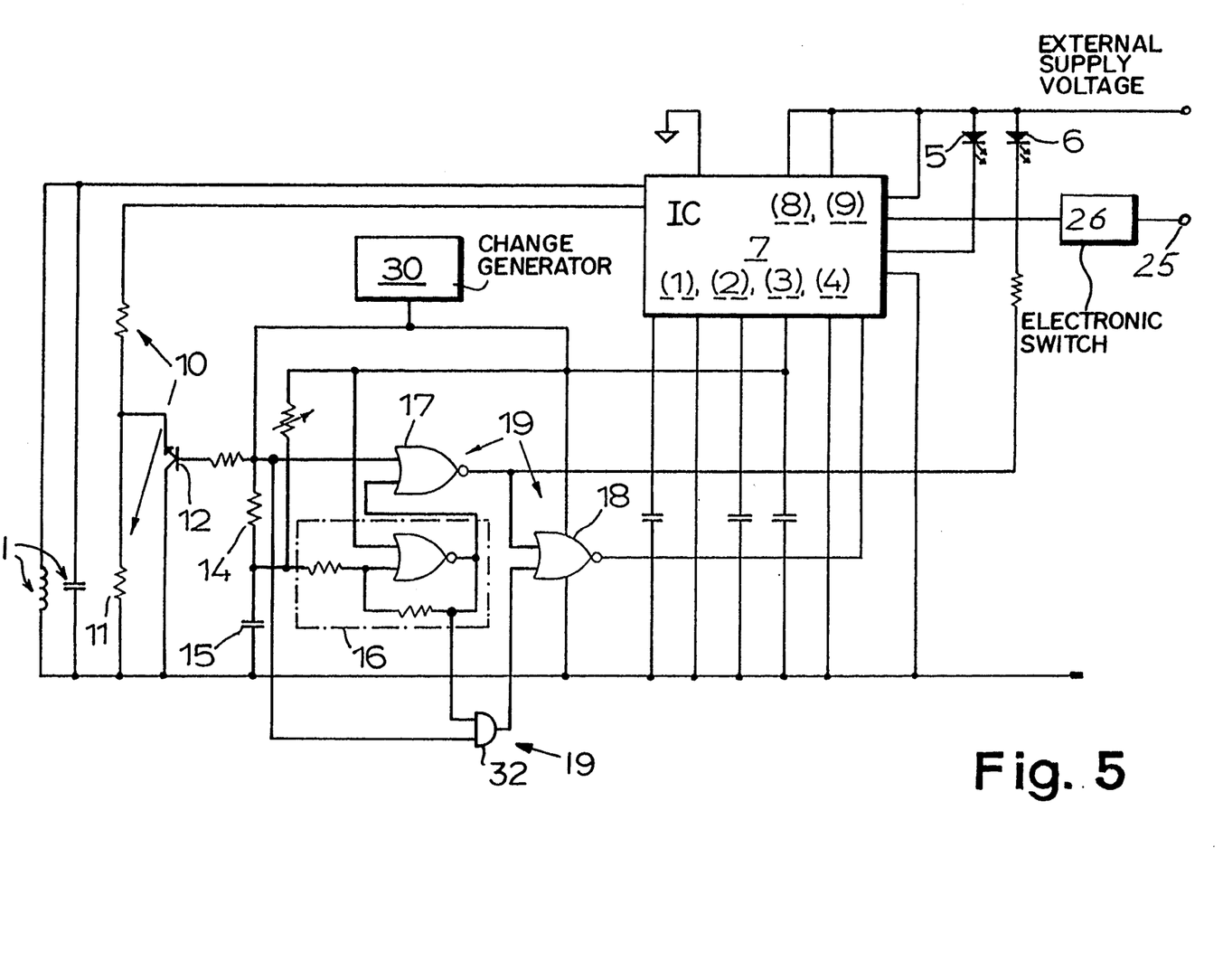
FIG. 5 is an alternative embodiment of the circuit of FIG. 4 using integrated circuit components.
Figure 6:
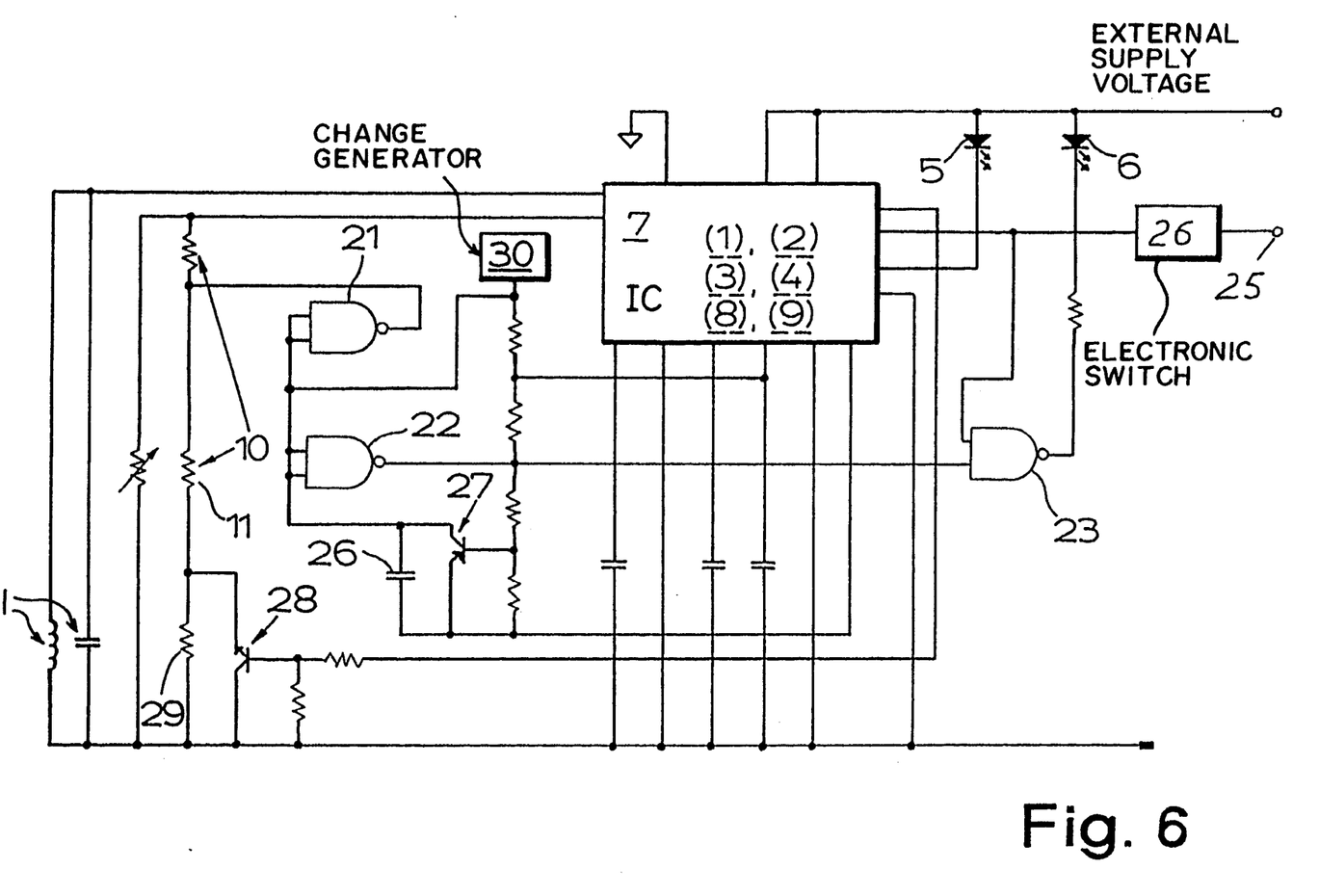
FIG. 6 is a block-schematic diagram of another embodiment of the circuit of FIG. 5, with logic gates substituted for a transistor switch.

In the inductive proximity switch represented in FIGS. 4 to 6, once the metal part (not shown) approaches to a predetermined sensing distance or retreats beyond a predetermined sensing distance, i.e., once the operation of oscillator 1 has been significantly influenced by the change in proximity of the metal part, the sensing distance adjustment is changed internally on a periodic basis. In particular, the sensing distance is reduced or increased, so that a significant change in the output signal of switching amplifier 2 occurring after the change in the adjustment of the sensing distance does not lead to a change in the switching state of the electronic switch 26. State indicator 6 is controlled by the significant change in the output signal of switching amplifier 2.

As noted previously, IC 7 includes a programming unit 9. Programming unit 9, which is connected upstream from the electronic switch 26, determines the normally-open or normally-closed contact characteristic of the device. In the embodiment of FIGS. 4 to 6, programming unit 9 is reprogrammed during operation of the device when a significant change in the output signal of switching amplifier 2 occurs after the change in the adjustment of the sensing distance. The reprogramming is performed such that a significant change in the output signal of switching amplifier 2 occurring after the change in the adjustment of the sensing distance does not lead to a change in the switching state of the electronic switch 26.

In the embodiments of FIGS. 4 to 6, a change generator 30 is provided which operates to periodically adjust the sensing distance by a "random amount," preferably at a relatively low change frequency of 5 cycles per second or less. The change generator is a means for low-frequency, cyclical switching to automatically adjust the sensing distance, and may be implemented for example using a microprocessor, a counter, or a low-frequency oscillator.

The general operation of the inductive proximity switch represented in FIGS. 4 to 6 is as follows: If the metal part (not shown) approaches the proximity switch at a predetermined minimum sensing distance, it causes a significant change in the output signal of switching amplifier 2. As a result, the state of the electronic switch 26 is changed. Change generator 30 then periodically reduces the sensing distance setting by short-circuiting single resistor 11 of sensing distance resistor network 10. If, by the change in the adjustment of the sensing distance, the output signal of switching amplifier 2 changes significantly, then this information is "suppressed" with respect to the switching state of the electronic switch 26 and programming unit 9 is reprogrammed. Shortly after the change in the adjustment of the sensing distance caused by change generator 30, this change is reversed, i.e., single resistor 11 of sensing distance resistor network 10 is again "activated." This cycle is constantly repeated, at the change frequency of change generator 30, so that switching amplifier 2 constantly alternates between states. This cycling of switching amplifier 2 is indicated using state indicator 6. A constantly repeating state change occurring at switching amplifier 2 thus indicates that the metal part (not shown) influencing oscillator 1 is located in the "unsafe range."

If the above-explained change in the adjustment of the sensing distance does not lead to a significant change in the output signal of switching amplifier 2, then the object influencing the operation of oscillator 1 is located in the "safe range."

In this operating mode, state indicator 6 actively indicates the "unsafe range": if the metal part (not represented) is located in the "unsafe range," then the LED provided as state indicator 6 illuminates. If desired, an inverter could be provided so that state indicator 6 illuminates when the metal part (not shown) is located in the "safe range."

If change generator 30 generates a "low" output level, then switching transistor 12 is conductive, and single resistor 11 of sensing distance resistor network 10 is short-circuited. (In FIG. 1, switching transistor 12 is represented as "normally operated." In contrast, switching transistor 12 in FIG. 2 is represented as "inversely operated," causing a lower saturation voltage to be reached). As soon as the low signal is present at the interconnection of a series circuit, located at change generator 30 and consisting of a charging resistor 14 and a charging capacitor 16, the output of a Schmitt trigger 16 connected there to its input conveys the low level signal. The output of Schmitt trigger 16 is connected to an input of XOR gate 19 consisting of two NOR gates 17, 18. The other input of XOR gate 19 is connected to change generator 30. The output of XOR gate 19 is connected to an input of programming unit 9 constructed using an XOR gate with its other input connected to switching output 20 of switching amplifier 2.

FIG. 5 shows an embodiment of the circuit of FIG. 4 in which an IC 7 is used to implement the functions of a portion of oscillator 1, switching amplifier 2 with demodulator 3 and Schmitt trigger 4, controller unit 8 and programming unit 9.

FIG. 6 shows another embodiment of the device shown in FIG. 5 in which NAND gates replace the transistor switch.

Specifically, in place of switching transistor 12 provided as shown in FIGS. 4 and 5, a NAND gate 21 is provided whose inputs are connected together so that, at the output, a signal that is inverse with respect to the signal at the input appears. Both inputs of NAND gate 21 are connected to the output of change generator 30. Another NAND gate 22 has its output connected to an input of a third NAND gate 23. The two inputs of NAND gate 22 are connected together to the output of change generator 30. The second input of third NAND gate 23 is connected to switching device output 25, while the cathode of the second LED state indicator 6 is connected to the output of third NAND gate 23. A charging capacitor 26, connected to change generator 30 and with a discharging transistor 27, connected in parallel and again operated inversely, causes the switching device to switch. Finally, a hysteresis transistor 28—again inversely operated—is provided, with which a hysteresis resistor 29 can be short-circuited.

I claim:

1. An electronic detecting device, comprising:

detecting means for responding to a location of a detected object;

signal processing means connected to the detecting means and providing a variable detection output having signal characteristics;

electronic switching means connected to the signal processing means and having a plurality of states and changing states in response to changes in detection output signal characteristics at a threshold level affected by ambient conditions;

state indicating means for indicating the operating state of the detecting means or the electronic switching means;

said state indicating means indicating whether the detected object is within a region having a predetermined boundary or outside the region, and indicating when the detected object is near to said boundary such that the state indicated is subject to error due to the influence of ambient conditions on circuit elements of the device;

wherein the device is constructed as an inductive proximity switch, and the detecting means is an oscillator having its operation influenced by the proximity of an approaching or retreating metal part;

further comprising:

sensing distance adjustment means for operating in an operation to vary the signal characteristics of the detection output produced in response to detection of a detected object at a particular location; and automatic adjusting means connected to the sensing distance adjustment means for adjusting the signal characteristics of the detection output to prevent further switching of the electronic switching means for a defined time period following a change in state of the electronic switching means.

2. The device of claim 1 further comprising programming unit means having a switching threshold level for providing a normally-open or normally-closed output switching in response to the level of an input, and having a program for processing the detection output, said programming unit means connected between the signal processing means and the electronic switching means, wherein when a change in the output signal of the signal processing means appears after said operation of the sensing distance adjustment means, the program of the programming unit means is modified to change the switching threshold level thereof.

3. An electronic detecting device, comprising:

detecting means for responding to a location of a detected object;

signal processing means connected to the detecting means and providing a detection output having signal characteristics;

electronic switching means connected to the signal processing means and having a plurality of states and changing states in response to changes in the signal characteristics of the detection output at a threshold level affected by ambient conditions;

state indicating means for indicating the operating state of the detecting means or the electronic switching means;

sensing distance adjustment means for varying the signal characteristics of the detection output produced in response to detection of a detected object at a particular location;

automatic adjusting means connected to the sensing distance adjustment means for adjusting the signal characteristics of the detection output to prevent further switching of the electronic switching means for a defined time period following a change in state of the electronic switching means;

wherein the automatic adjusting means comprise change generator means for cyclically alternatively increasing and decreasing a signal characteristic quantity of the detection output level by an amount, thus preventing changes below a set order of magnitude in the output signal of the signal processing means from producing a change in the switching state of the electronic switching means.

4. The device of claim 3 wherein the change generator means changes the adjustment of the detection output signal characteristics at a change frequency on the order of 5 Hertz or less.

5. The device of claim 3 wherein the detecting means comprises an oscillator including at least one sensing distance resistor for setting the effective detection output signal characteristics, wherein the effective resistance value of the sensing distance resistor is varied by the change generator means.

6. The device of claim 5 wherein the oscillator includes a sensing distance resistor network comprising a plurality of resistors for setting the effective detection output signal characteristics, wherein at least one resistor of the sensing distance resistor network is selectively switched out of the sensing distance resistor network by the sensing distance adjustment means to adjust the effective resistance of the sensing distance resistor network.

7. The device of claim 3 further comprising programming unit means having a switching threshold level for providing a normally-open or normally-closed output switching in response to the level of an input, and having a program for processing the detection output, said programming unit means connected between the signal processing means and the electronic switching means, wherein when a change in the output signal of the signal processing means appears after said operation of the sensing distance adjustment means, the program of the programming unit means is modified to change the switching threshold level thereof.

* * * * *